(12) United States Patent
Ott et al.

(10) Patent No.: US 7,239,066 B2
(45) Date of Patent: Jul. 3, 2007

(54) PIEZOELECTRIC GENERATORS AND METHODS OF OPERATING SAME

(75) Inventors: William F. Ott, Williamsburg, VA (US); Edward T. Tanner, Williamsburg, VA (US)

(73) Assignee: Par Technologies, LLC, Hampton, VA (US)

( * ) Notice: Subject to any disclaimer, the term of this patent is extended or adjusted under 35 U.S.C. 154(b) by 61 days.

(21) Appl. No.: 10/869,046

(22) Filed: Jun. 17, 2004

(65) Prior Publication Data

US 2005/0280334 A1 Dec. 22, 2005

(51) Int. Cl.
*H01L 41/113* (2006.01)
(52) U.S. Cl. .................. 310/339; 310/331; 310/340
(58) Field of Classification Search ........... 310/339, 310/340, 331, 341
See application file for complete search history.

(56) References Cited

U.S. PATENT DOCUMENTS

| | | | |
|---|---|---|---|
| 3,230,402 A | | 1/1966 | Nightingale et al. |
| 3,350,583 A | * | 10/1967 | Schiavone ............. 310/319 |
| 3,876,925 A | | 4/1975 | Stoeckert |
| 4,387,318 A | * | 6/1983 | Kolm et al. ............. 310/330 |
| 4,411,591 A | * | 10/1983 | Hesting ................ 415/103 |
| 4,834,610 A | * | 5/1989 | Bond, III ............... 415/53.3 |
| 5,512,795 A | | 4/1996 | Epstein et al. |
| 5,621,264 A | * | 4/1997 | Epstein et al. ........... 310/339 |
| 5,751,091 A | | 5/1998 | Takahashi et al. |
| 5,801,475 A | * | 9/1998 | Kimura ................. 310/319 |
| 5,814,921 A | * | 9/1998 | Carroll ................. 310/339 |
| 5,835,996 A | | 11/1998 | Hashimoto et al. |
| 6,194,815 B1 | | 2/2001 | Carroll |
| 6,252,336 B1 | | 6/2001 | Hall |

(Continued)

FOREIGN PATENT DOCUMENTS

JP 08-140369 * 5/1996

(Continued)

OTHER PUBLICATIONS

Tanner, "Combined Shock and Vibration Isolation Through the Self-Powered, Semi-Active Control of a Magnetorheological Damper in Parallel with an Air Spring", Dissertation submitted to the faculty of the Virginia Polytechnic Institute and State University, Dec. 2003.

(Continued)

*Primary Examiner*—Thomas M. Dougherty
(74) *Attorney, Agent, or Firm*—Nixon & Vanderhye, P.C.

(57) ABSTRACT

A piezoelectric power generator (20, 120) comprises plural piezoelectric devices (22, 122); an actuator (24) positioned to impart an excitation to the plural piezoelectric devices (22, 122) in a predefined sequence; and, an electrical conduction system (30) connected to the plural piezoelectric devices for conducting an electrical charge created by the excitation. Preferably the plural piezoelectric devices (22, 122) are arranged in a predetermined relationship relative to the actuator (24) whereby only one of the plural piezoelectric devices (22, 122) is actuated at a time. For example, the plural piezoelectric devices (22, 122) can be arranged in an angular pattern (such as a circular pattern) relative to the actuator (24). Preferably, a rotational speed of the actuator (24) permits an excitation response for a given plural piezoelectric device (22, 122) to essentially fully decay before the given plural piezoelectric device (22, 122) is again excited.

28 Claims, 16 Drawing Sheets

U.S. PATENT DOCUMENTS

| | | |
|---|---|---|
| 6,407,484 B1 | 6/2002 | Oliver et al. |
| 2002/0121844 A1 | 9/2002 | Ghandi et al. |
| 2002/0195823 A1 | 12/2002 | Aguire |
| 2003/0057618 A1 | 3/2003 | Tanner |
| 2004/0075363 A1 | 4/2004 | Malkin et al. |

FOREIGN PATENT DOCUMENTS

| | | | |
|---|---|---|---|
| JP | 11-330582 | * | 11/1999 |
| JP | 2002-262584 | * | 9/2002 |
| JP | 2002-366072 | * | 12/2002 |
| JP | 2004-166442 | * | 6/2004 |

OTHER PUBLICATIONS

International Search Report and Written Opinion mailed Dec. 22, 2005 in corresponding PCT Appl. No. PCT/US05/21304.

* cited by examiner

PIEZOELECTRIC GENERATORS AND METHODS OF OPERATING SAME

BACKGROUND

1. Field of the Invention

The present invention pertains to employment of a piezoelectric device to scavenge and store ambient energy.

2. Related Art and Other Considerations

Scavenging and storing ambient energy has long been a scientific curiosity. Many types of ambient energy have been harvested with varying degrees of success. These include solar, wind and vibration energy to name a few. The concept of scavenging vibration energy with piezoelectric devices has received considerable attention, but until recently the amount of energy produced by a piezoelectric device was considered insufficient for powering any reasonable scale device. The advent of ultra-low power electronics has renewed interest in piezogenerators as potential power sources for these new devices.

A recent approach to piezoelectric power generation involves using many piezogenerators operating in parallel to produce much greater power outputs. Tanner, E. T., "Combined Shock and Vibration Isolation Through the Self-Powered, Semi-Active Control of a Magnetorheological Damper in Parallel with an Air Spring," Dissertation submitted to Virginia Polytechnic and State University, Dec. 2003.

BRIEF SUMMARY

A piezoelectric power generator comprises plural piezoelectric devices; an actuator positioned to impart an excitation to the plural piezoelectric devices in a predefined sequence; and, an electrical conduction system connected to the plural piezoelectric devices for conducting an electrical current created by the excitation. Preferably the plural piezoelectric devices are arranged in a predetermined relationship relative to the actuator whereby only one of the plural piezoelectric devices is actuated at a time. For example, the plural piezoelectric devices can be arranged in an angular pattern (such as a circular pattern) relative to the actuator.

In an example embodiment in which the pattern of the plural piezoelectric devices is a circular pattern, the actuator is a rotary member positioned proximate a center of the circular pattern. The actuator is a rotary cam having a lobe which excites each of the plural piezoelectric devices once during a revolution of the cam. A rotational speed of the actuator permits an excitation response for a given plural piezoelectric device to essentially fully decay before the given plural piezoelectric device is again excited.

In one example embodiment, at least one of the plural piezoelectric devices is a cantilever device having a fixed end proximate a perimeter of the circular pattern and a free end proximate the center of the circular pattern. The cantilever piezoelectric device comprises an elongated core; a first piezoceramic element bonded to a first side of the core; and, a second piezoceramic element bonded to a second side of the core. Optionally, the cantilever piezoelectric device comprises a first covering bonded to the first piezoceramic element and a second covering bonded to the second piezoceramic element.

In another example embodiment, at least one of the plural piezoelectric devices comprises a stack of piezoceramic layers which are stacked in a radial direction relative to the circular pattern. An electrode is positioned between an adjacent pair of piezoceramic layers of a stack. The actuator is a rotary cam having a lobe which excites each of the plural piezoelectric devices once during a revolution of the cam by compressing the stack of piezoceramic layers of a stack.

A driver for the actuator causes the actuator to excite a given plural piezoelectric device after a previous excitation response for the given plural piezoelectric device has essentially fully decayed. This minimizes the torque required to rotate the actuator and thus the power input to the piezoelectric power generator.

A method of operating a piezoelectric power generator comprises the steps of using an actuator to impart an excitation to plural piezoelectric devices arranged in a predefined sequence, and (when necessary) rectifying and conducting an electrical current created by the excitation. Preferably, the actuator excites a given plural piezoelectric device after a previous excitation response for the given plural piezoelectric devices has essentially fully decayed. Preferably, the actuator applies a force to each plural piezoelectric device which proximates a maximum allowable stress for the plural piezoelectric device.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

Figure 1:
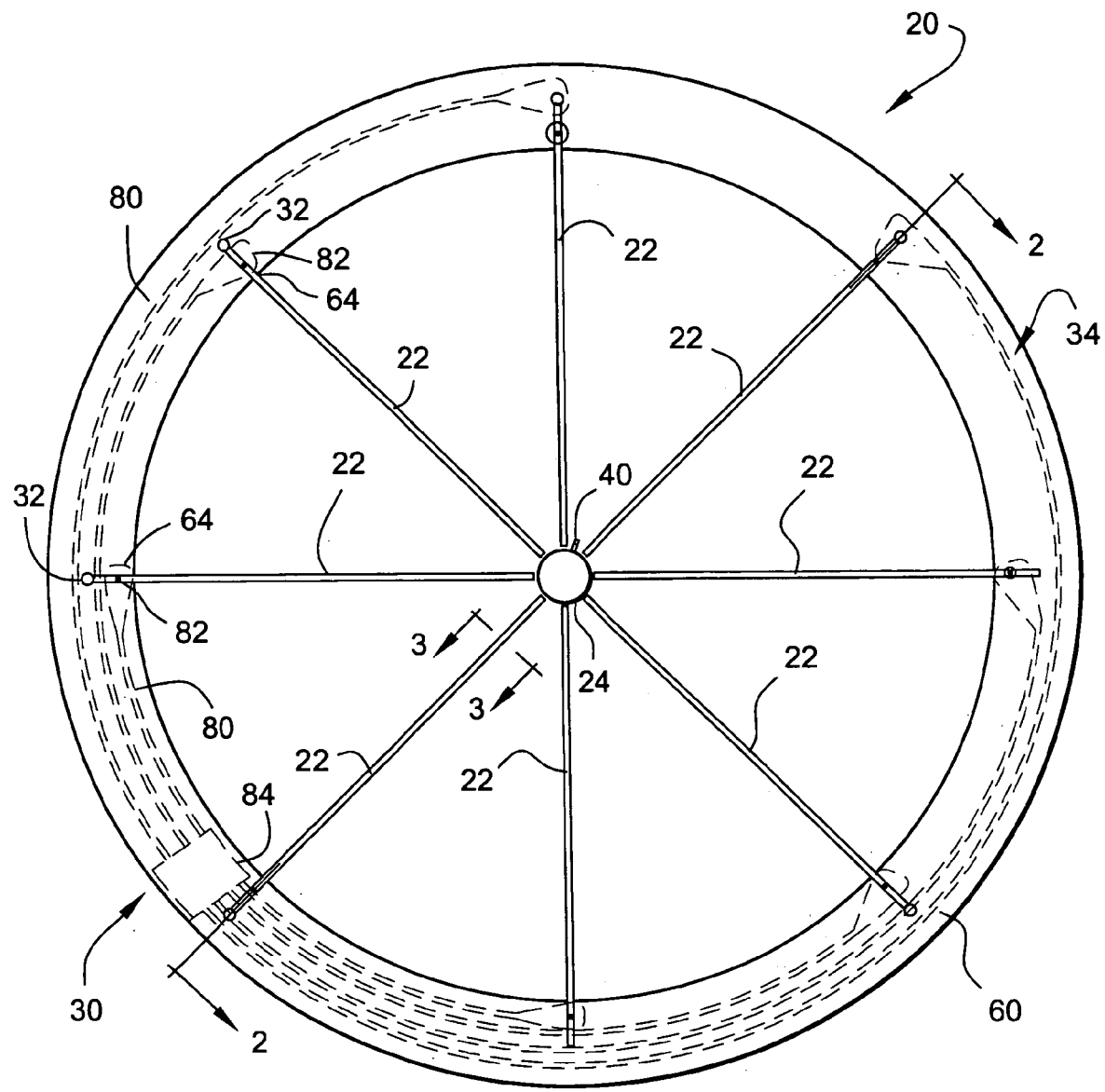
FIG. 1 is a plan view of a first example embodiment of a piezoelectric generator.

FIG. 1 shows a non-limiting example generic embodiment of a piezoelectric power generator. The piezoelectric power generator 20 comprises plural piezoelectric devices 22; an actuator 24 positioned to impart an excitation to the plural piezoelectric devices 22 in a predefined sequence; and, an electrical conduction system 30 connected to the plural piezoelectric devices 22 for conducting an electrical charge created by the excitation.

In the example embodiment of FIG. 1, at least one and preferably all of the plural piezoelectric devices 22 are cantilever devices having a fixed end 32 mounted or formed on a generator frame 34. The piezoelectric devices 22 can be affixed or mounted at their fixed ends 32 to generator frame 34 by any suitable means. For example, the fixed ends 32 of piezoelectric devices 22 can take the form of post 33 or other connective structure which is anchored or otherwise secured to generator frame 34. Alternatively, the fixed ends 32 of piezoelectric devices 22 can be affixed to generator frame 34 by an appropriate fastener or adhesive.

Preferably the plural piezoelectric devices 22 are arranged in a predetermined relationship relative to the actuator 24 so that only one of the plural piezoelectric devices 22 is actuated at a time. For example, and as illustrated in the embodiment of FIG. 1, the plural piezoelectric devices 22 can be arranged in circular pattern relative to the actuator. The circular pattern of arrangement of the piezoelectric devices 22 is but one example possible pattern. Patterns of other shapes, e.g., other angular shapes such as a partial circle or curved pattern, are also possible.

In an example embodiment in which the pattern of the plural piezoelectric devices is a circular pattern, the actuator 24 is a rotary member positioned proximate a center of the circular pattern. For example, the actuator 24 can be a rotary cam having a lobe 40 which excites each of the plural piezoelectric devices 22 once during a revolution of the actuator 24. Revolution of the actuator 24 is accomplished by a motive device 42 such as a motor or other driver. In the particular example shown in FIG. 1, the motive device 42 has an output or drive shaft 44 which is surmounted by actuator 24.

"Exciting" or "excitation" of a piezoelectric device 22 involves contacting, striking, compressing, or other wise imparting a vibratory or kinetic movement of the piezoelectric device 22 sufficient to harvest an electric current therefrom. Preferably the rotational speed of the actuator 24 is established or chosen to permit an excitation response for a given one of the plural piezoelectric devices 22 to essentially fully decay before the given one of the plural piezoelectric devices is again excited. More preferably, the excitation response for any one of the piezoelectric devices 22 essentially fully decays before that one piezoelectric device 22 is again excited.

The example generator frame 34 of FIG. 1 happens also to be circular to mirror the circular pattern in which the piezoelectric devices 22 are arranged. Other shapes of the generator frame 34 are also possible, depending on desired form factor or environmental application. The generator frame 34 has a central cavity 46 situated beneath actuator 24 for accommodating motive device 42.

Figure 2A:
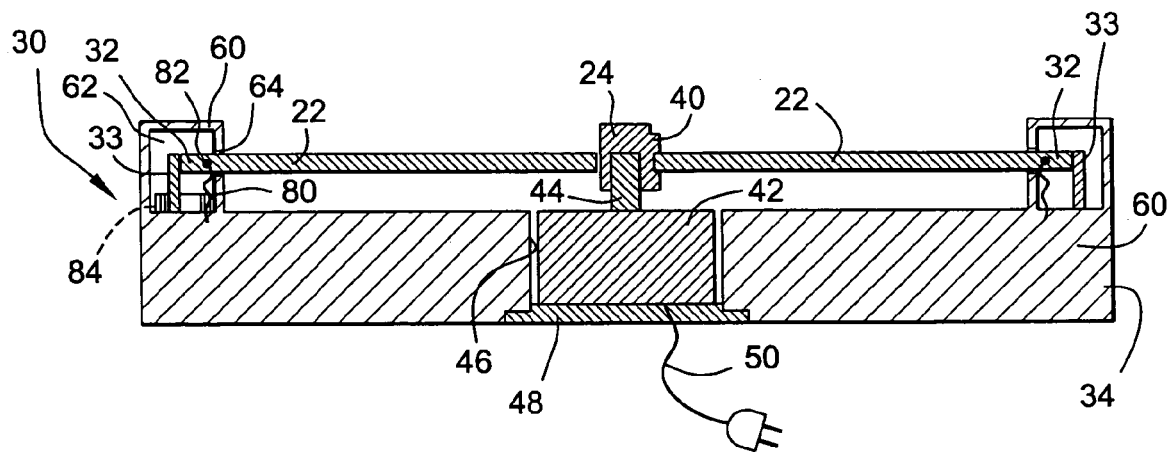
FIG. 2A is a sectioned side view of the piezoelectric generator of FIG. 1 for an embodiment in which a motive device is an AC motor.

As illustrated in FIG. 2A, in one example implementation the motive device 42 can take the form of an alternating current (AC) motor. In such implementation, the central cavity 46 may be closed from the bottom of generator frame 34 by a lid or cover 48. In the event that motive device 42 is an electric motor powered by AC current, an aperture or the like may extend through cover 48 or elsewhere through generator frame 34 for accommodating a power cord 50.

Figure 2B:
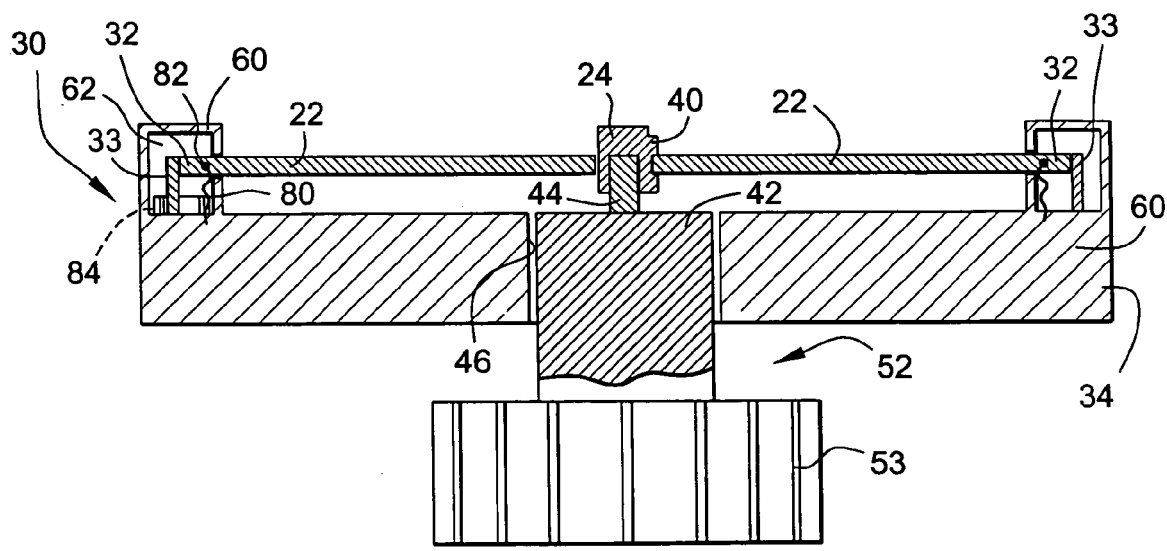
FIG. 2B is a sectioned side view of the piezoelectric generator of FIG. 1 for an embodiment in which a motive device is a turbine such as a water turbine.
Figure 2C:
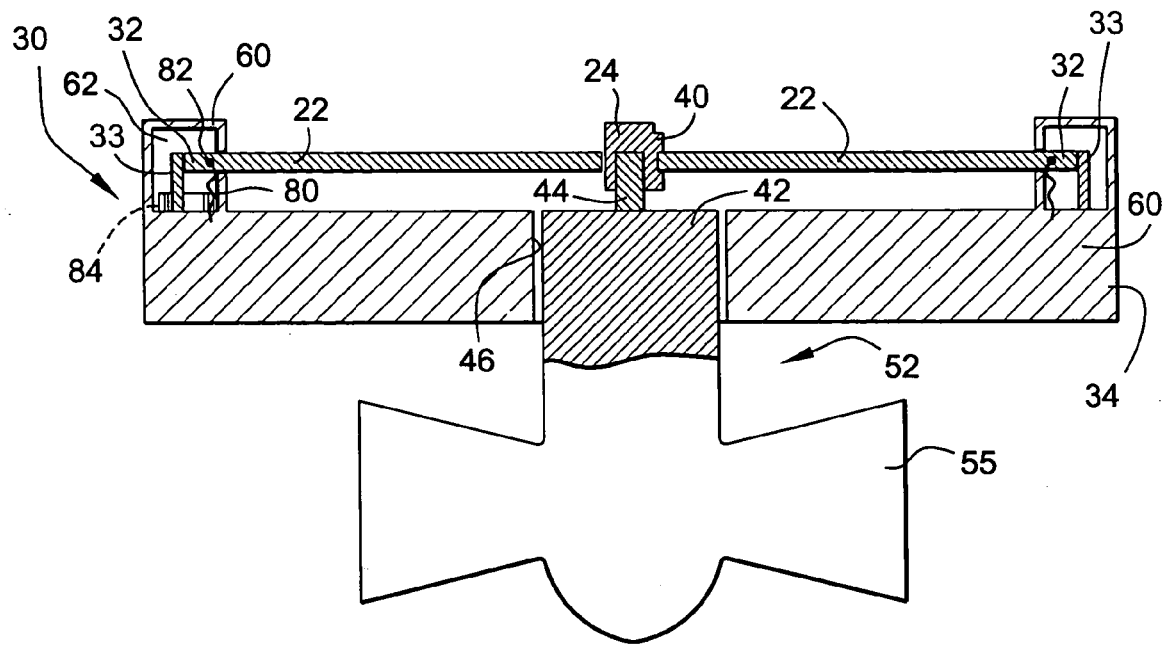
FIG. 2C is a sectioned side view of the piezoelectric generator of FIG. 1 for an embodiment in which a motive device is a turbine such as a wind vane.
Figure 2D:
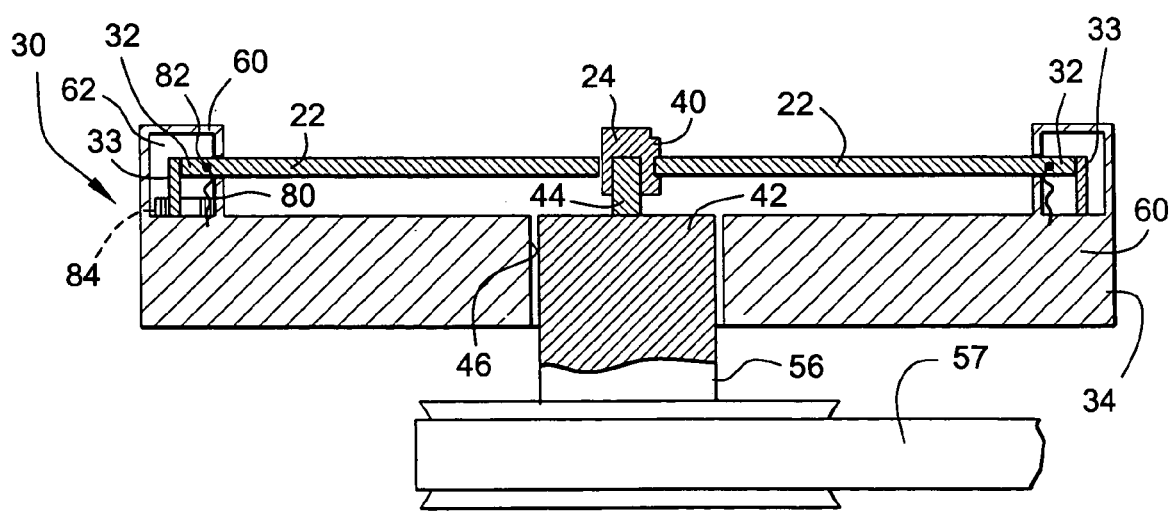
FIG. 2D is a sectioned side view of the piezoelectric generator of FIG. 1 for an embodiment in which a motive device comprises a power takeoff from another motor or generator.

The type of motive device 42 is not limited to an electrical motor, as other types of motive devices may be employed. For example, as illustrated in FIG. 2B, the motive device 42 can take the form of a turbine 52 having vanes 53 of a paddlewheel type structure, for example. As another alternative implementation illustrated in FIG. 2C, the motive device 42 can be a windmill type turbine 54 having wind vanes 55. As yet another alternative implementation illustrated in FIG. 2D, the motive device 42 can be a flywheel-responsive pulley 56 entrained by a belt 57, or similar power take off device which derives or obtains power from another motor or generator (e.g., in like manner as an alternator is driven by a flywheel of an internal combustion engine). In situations in which the motive device 42 is dependent upon a variable energy source (e.g., a changing wind current), an appropriate governor or regulator, or even a clutch mechanism, may also be provided so that the actuator 24 rotates an a desired rotational speed as above noted.

Figure 2E:
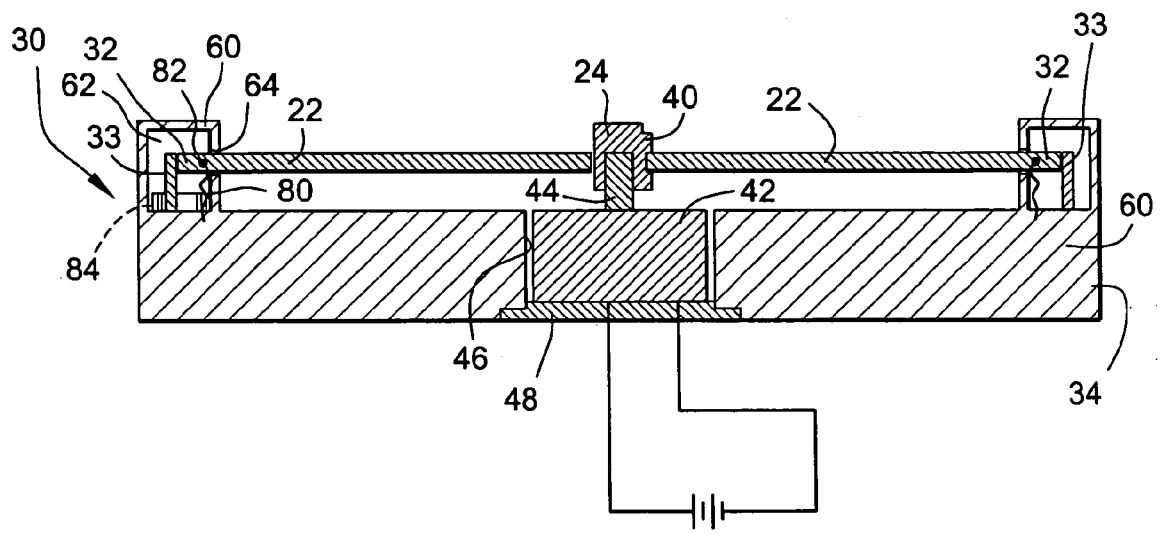
FIG. 2E is a sectioned side view of the piezoelectric generator of FIG. 1 for an embodiment in which a motive device comprises a power takeoff from a direct current (DC) motor.
Figure 2F:
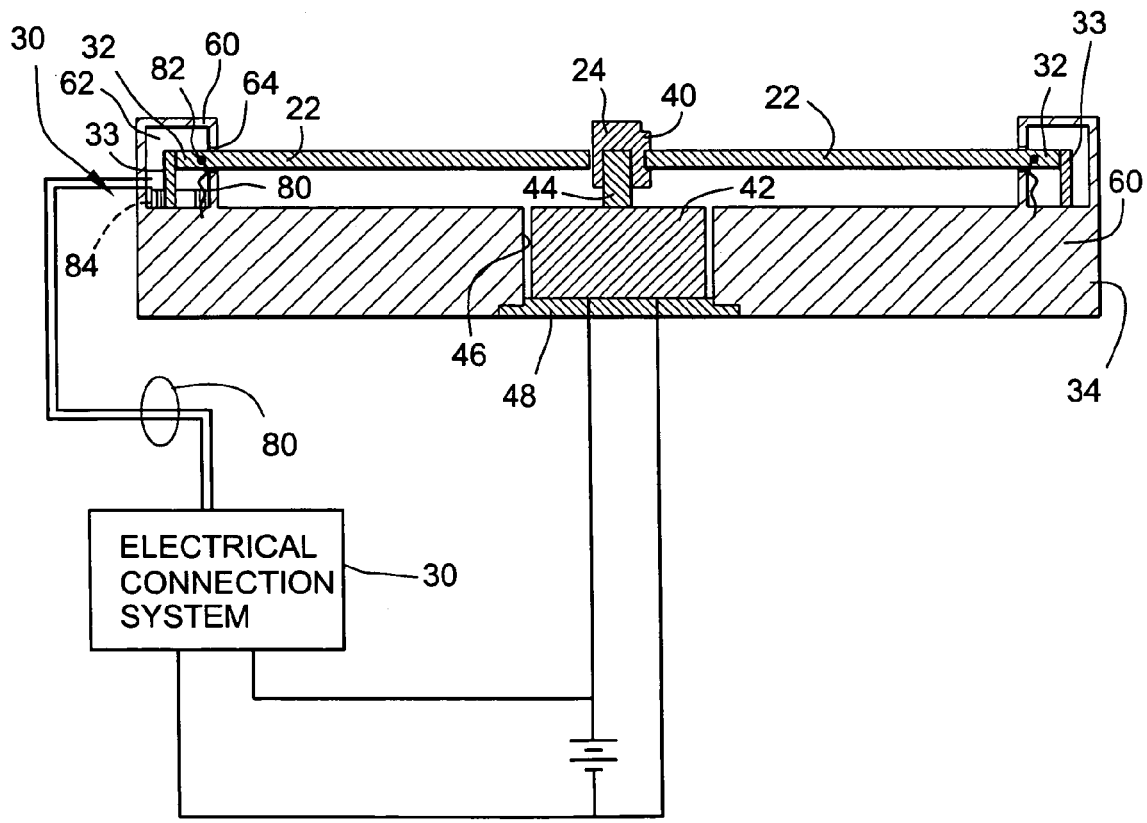
FIG. 2F is a sectioned side view of the piezoelectric generator of FIG. 1 for an embodiment in which a motive device is augmented with energy harvested by the piezoelectric generator.

FIG. 2E shows the motive device 42 taking the form of a direct current (DC) motor or DC energy source. FIG. 2F further illustrates that the motive device may be augmented with energy harvested from the power generation system itself. For sake of illustration, FIG. 2F shows the electrical conduction system 30 as being a functional block which is connected by electrical leads 80 to the piezoelectric devices 22, and in parallel across a battery for the DC motive device 42. It should be understood that this feedback or reinvestment of energy harvested by the power generation system is not confined to an embodiment wherein the motive device 42 is the illustrated DC motor, but with appropriate adaptations the reinvestment or feedback may also be provided for other types of motive devices such as those previously described.

The example generator frame 34 shown in FIG. 1 has an elevated periphery or rim 60. The rim 60 contains a ring-shaped cavity 62 which extends substantially around the generator frame within rim 60. The fixed ends 32 of piezoelectric devices 22 extend through radial apertures 64 formed in rim 60 and protrude into cavity 62. The post 32 is positioned within cavity 62 to retain the fixed end 32 to a cavity floor of generator frame 64. The fitting of the piezoelectric device 22 through the aperture 64 in rim 60 serves to clamp or hold the piezoelectric device 22 at a position along the length of piezoelectric device 22 which permits an appropriate shearing in the piezoelectric layers of piezoelectric device 22. The piezoelectric devices 22 may be mounted and positioned using other structures or mechanisms, so long as held at a position to facilitate shearing in the piezoelectric layers of the piezoelectric devices 22. For example, rather than having a rim-shaped periphery, the generator frame 34 may be provided with a clamp or bracket for each of the piezoelectric devices 22. Alternatively, an adhesive or other structure for applying physical pressure to piezoelectric devices 22 may mount the piezoelectric devices 22 on the generator frame 34.

However mounted, the piezoelectric devices 22 are oriented so that their free ends are free to vibrate and are horizontally aligned with actuator 24 so that their free ends can be excited by actuator 24. Thus, in the example embodiment illustrated in FIG. 1 and FIG. 2, at least one of the plural piezoelectric devices 22 is a cantilever having a fixed end 32 proximate the perimeter of the circular pattern (e.g., on rim 60) and a free end proximate the center of the circular pattern.

Figure 3:
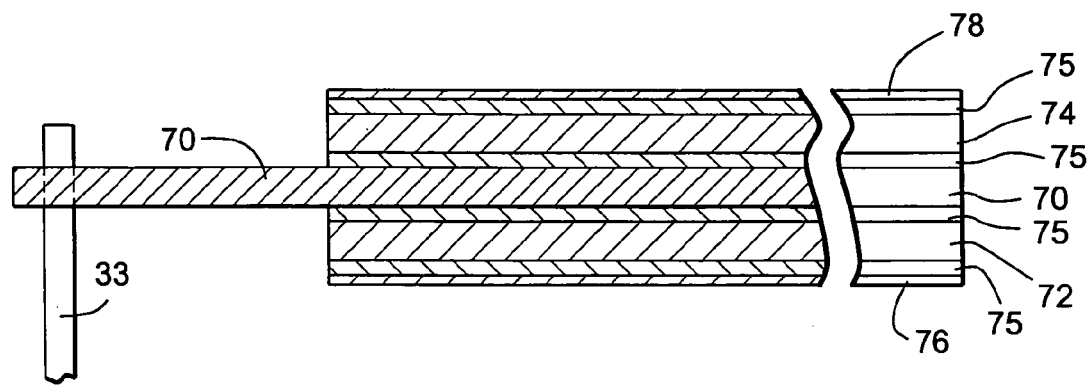
FIG. 3 is a sectioned side view of a cantilever type piezoelectric device.

In one example embodiment illustrated in FIG. 3, the cantilever piezoelectric device 22 has a horizontally layered structure, e.g., a layered structure which capitalizes upon shearing movement of the piezoelectric elements. In particular, the piezoelectric device 22 of FIG. 3 comprises an elongated core 70; a first piezoceramic element 72 bonded to a first side of the core 70; and, a second piezoceramic element 74 bonded to a second (opposite) side of the core 70. Both of the first piezoceramic element 72 and second piezoceramic element 74 have a sputtered electrode 75 formed on at least part, and possibly all, of the major side surfaces. The sputtered electrodes 75 may be, for example, of Nickel or of Silver. Optionally, the cantilever piezoelectric device comprises a first covering 76 bonded to the first piezoceramic element 72 and a second covering 78 bonded to the second piezoceramic element 74.

At the fixed end of the piezoelectric device 22, the elongated core 70, also known as the shim, protrudes beyond the other layers (e.g., further into the cavity 62 of rim 60). The extended portion of the elongated core 70 is secured to generator frame 34 by the post 33.

In the particular example piezoelectric power generator 20 of FIG. 1, eight cantilevered "bimorph" piezoelectric devices 22 are arranged around, and driven by, a central, rotating cam 24 on shaft 44. In an example in which the piezoelectric devices 22 are formed with the particular horizontal layering of FIG. 3, the piezoelectric devices 22 are 0.5 inches wide and have a 2.0 inch bending length. Each piezoelectric device 22 is shown in cross section in FIG. 3 as being fabricated from two 0.0075 inch thick piezoceramics elements 72, 74 that have been bonded to a 0.004 inch thick stainless steel shim or core 70. Additionally the two covering layers 76, 78 are bonded to the outermost layers of the structure to strengthen the piezoelectric device 22. The two covering layers 76, 78 can be fabricated from 0.001 inch thick aluminum, for example.

The electrical conduction system 30 comprises a set of dual electrical leads 80 for connecting each piezoelectric device 22 to an electrical circuit 84. In FIG. 1, electrical circuit 84 of electrical conduction system 30 is shown as a broken line depicting a circuit board or circuit card or the like. The electrical leads 80 are preferably routed around the cavity 62 of rim 60 of generator frame 32. Other routing schemes may be employed for embodiments in which the generator frame 32 does not have a rim.

The actual structure of the piezoelectric devices 22, the configuration of the electrical circuit 84, and the manner of electrical connection thereto actually depends on the poling technique employed for the first piezoceramic element 72 and the second piezoceramic element 74.

Figures 3A, 3B:
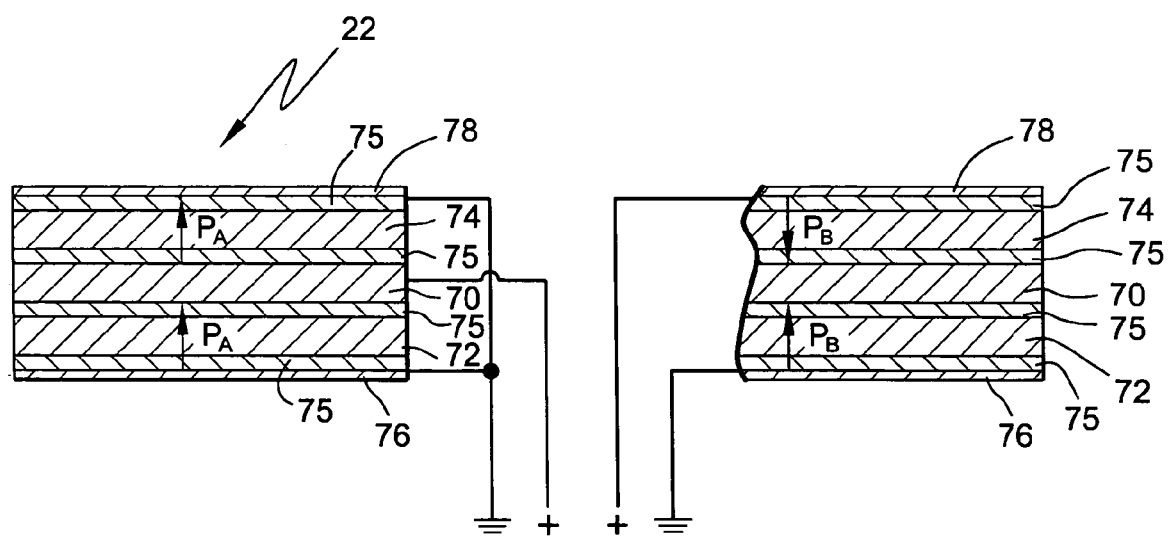
FIG. 3A is a sectioned radial view taken along line 3—3 of FIG. 1 of a example embodiment cantilever device in which the piezoceramic elements of the cantilever device are poled unidirectionally.
FIG. 3B is a sectioned radial view taken along line 3—3 of FIG. 1 of a example embodiment cantilever device in which the piezoceramic elements of the cantilever device are poled oppositely.
Figure 4A:
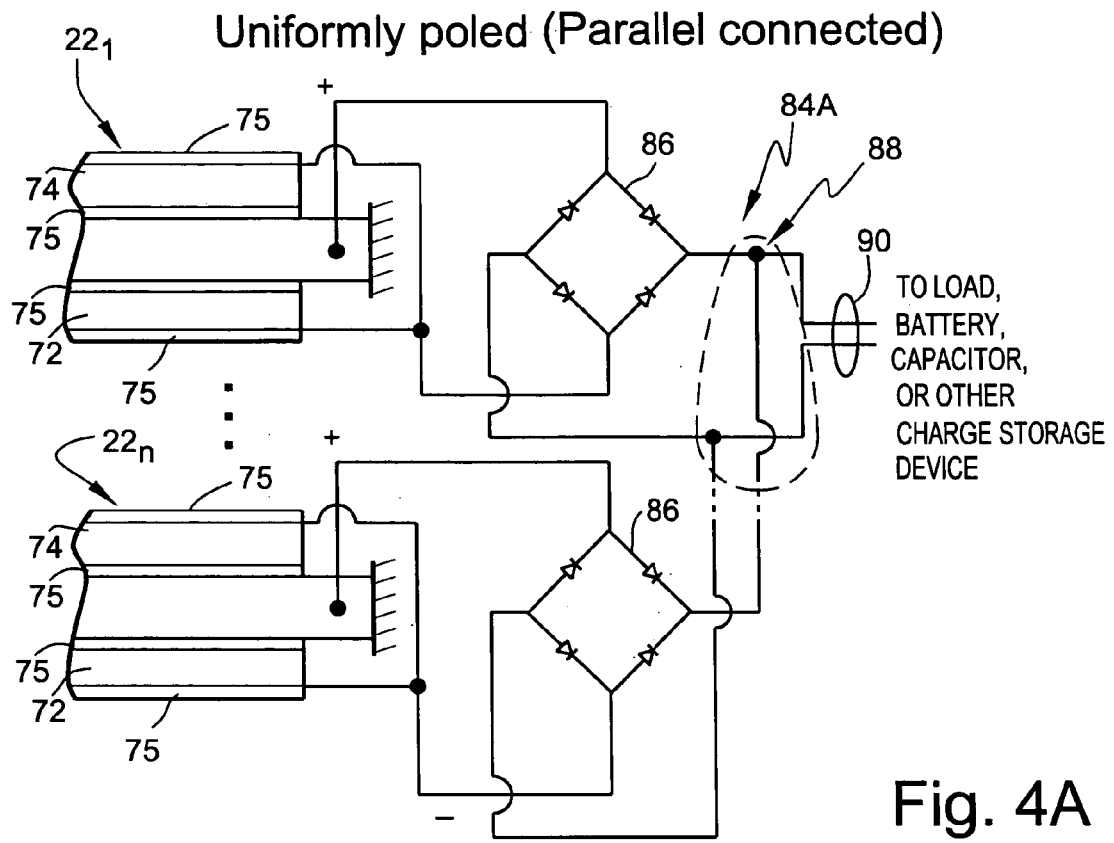
FIG. 4A is a schematic view of a first example electrical circuit utilized in an electrical conduction system of the piezoelectric power generator of FIG. 1.

FIG. 4A illustrates a first example implementation of electrical circuit 84 of electrical conduction system 30, e.g., electrical circuit 84A, for a situation in which the piezoceramic elements 72, 74 of the cantilever device 22 are poled unidirectionally. The unidirectional poling of piezoceramic elements 72, 74 is particularly illustrated in FIG. 3A, which is a sectioned radial view taken along line 3—3 of FIG. 1. The unidirectional poling (e.g., same direction poling) for piezoceramic elements 72, 74 is depicted in FIG. 3A by the unidirectional arrows $P_A$.

FIG. 4A and FIG. 3A show that the positive electrodes of the uniformity poled piezoceramic elements, i.e., first piezoceramic element 72 and second piezoceramic element 74, are connected together on the one hand, while on the other hand the negative electrodes of the of the uniformity poled piezoceramic elements are connected together. That is, for a given piezoelectric device 22, the positive electrodes of the two piezoceramic elements are connected by a positive lead of the electrode set 80 to a positive terminal of a full wave bridge rectifier 86 and the negative electrodes of the two piezoceramic elements are connected by a negative lead of the electrode set 80 to a negative terminal of the full wave bridge rectifier 86. Partial structure and electrical leads for piezoelectric device $22_1$ and for piezoelectric device $22_n$ are illustrated in FIG. 4A, it being understood that intermediately numbered piezoelectric devices 22 are also comparably connected. Thus, the positive and negative AC electrical leads for each piezoelectric device 22 are connected to respective input points of a full wave bridge rectifier 86 (there being one full wave bridge rectifier 86 for each piezoelectric device 22). In the FIG. 4A embodiment, the resulting DC signals obtained from all piezoceramic elements 72 are connected together as at adder 88 to form a composite output signal from piezoelectric power generator 20 on DC line 90. The output signal on line 90 can be appropriately connected to, e.g., a load, a battery, a capacitance, or other charge storage device.

Figure 4B:
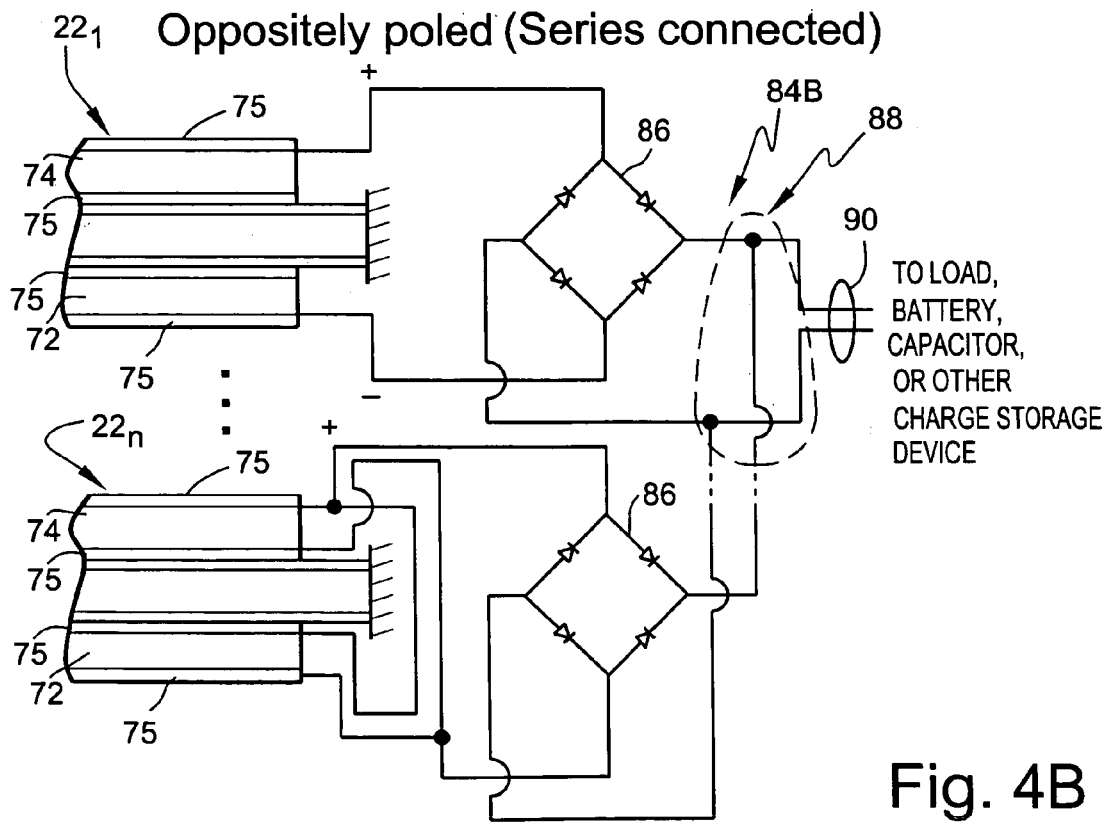
FIG. 4B is a schematic view of a first example electrical circuit utilized in an electrical conduction system of the piezoelectric power generator of FIG. 1.

FIG. 4B illustrates a second example implementation of electrical circuit 84 of electrical conduction system 30, e.g., electrical circuit 84B, for a situation in which the piezoceramic elements 72, 74 of the cantilever device 22 are oppositely poled. The opposite direction poling of piezoceramic elements 72, 74 is particularly illustrated in FIG. 3B, which also is a sectioned radial view taken along line 3—3 of FIG. 1. The opposite directional poling for piezoceramic elements 72, 74 is depicted in FIG. 3B by the arrows $P_B$. FIG. 4B shows the positive electrical lead being connected to an electrode for piezoceramic element 74 and the negative electrical lead being connected to an electrode for the piezoceramic element 72. In other respects, the electrical circuit 84B of FIG. 4B is similar to that of FIG. 4A in that the positive and negative AC electrical leads for each piezoelectric device 22 are connected to respective input points of a full wave bridge rectifier 86; and the resulting DC signals obtained from all piezoceramic elements 72 are connected together as at adder 88 to form a composite output signal from piezoelectric power generator 20 on DC line 90. As previously mentioned, the output signal on line 90 can be appropriately connected to, e.g., a load, a battery, a capacitance, or other charge storage device.

The electrical leads 80 as described above, when connected to the electrodes 75 of a piezoelectric device 22, can comprise a thin (e.g., one millimeter) stainless flat lead which is sandwiched between the electrode 75 for the piezoceramic element and the covering layer (e.g., layer 76 or layer 78, as the case may be).

By taking the product of the RMS voltage and current, the average power produced by the each piezoelectric device 22 can be calculated. The input to the piezoelectric device 22 was determined by calculating the force applied at the (free end) tip of the cantilevered bimorph that would result in a maximum stress value that was very near the allowable maximum dynamic stress in the piezoceramic element (e.g., first piezoceramic element 72 and second piezoceramic element 74). From this force, and the calculated stiffness of the cantilever, the tip deflection to achieve the required force can be determined. The lobe 40 of the actuator 24 was then designed to provide this tip deflection. The calculated tip deflection was 0.125 inches and the calculated force required to achieve that deflection was 0.27 lbf.

As mentioned above, the actuator 24 is preferably configured to engage only one piezoelectric device 22 at a time. This configuration and individual excitation minimizes the torque required to rotate the actuator 24, and thus the power input to the piezoelectric power generator 20. The rotational speed of the actuator 24 is chosen or established to ensure that the response of each cantilever fully decays prior to being excited again by the passing cam lobe 40. That is, the motive device 42 for the actuator 24 causes the actuator 24 to excite a given plural piezoelectric device 22 after a previous excitation response for the given plural piezoelectric device has essentially fully decayed.

The displacement (in inches) of a single cantilever (i.e., single piezoelectric device 22) over a time period comprising plural excitations of the piezoelectric device is shown in FIG. 4. This displacement ensures that the maximum amount of energy is scavenged from each piezoceramic device 22. Furthermore, by considering the angular placement of each cantilvered piezogenerator 22, the piezoelectric power generator 20 can be designed such that the sum on the current output of all eight of the piezoceramic devices 22 overlaps in such a way that the greatest average power output from the rotary piezogenerator 20 is achieved. The optimal rotational speed for this device was determined to be 400 revolutions per minute (RPM).

The power required to rotate the actuator 24 (e.g., camshaft) can be easily determined. The power P required to turn a shaft (e.g., actuator 24) is given by Equation 1.

$$P=T\omega \qquad \text{Equation 1}$$

In Equation 1, T is the torque required to turn the actuator 24 and ω is the rotational velocity of the actuator 24 in rad/s. The force F required to deflect each cantilever 22 was given above as 0.27 lbf. The radial distance r from the center of the actuator 24 to the point of engagement with the piezoelectric device 22 is 0.19 inches (0.0158 ft). Therefore, the torque on the actuator 24 when the piezoelectric device 2 is fully deflected by the cam lobe 24 is given by Equation 2.

$$T=Fr \qquad \text{Equation 2}$$

Substituting Equation 2 into 1 gives Equation 3.

$$P=Fr\omega \qquad \text{Equation 3}$$

Provided F is in ft·lbs, r is in ft and ω is in radian/second, the power can be converted to watts by Equation 4.

$$\text{Equation 4:} \quad P\left(\frac{\text{ft}\cdot\text{lb}}{\text{s}}\right)\times\frac{1W}{0.738\ \text{ft}\cdot\text{lb/s}}=P(W)$$

Figure 6:
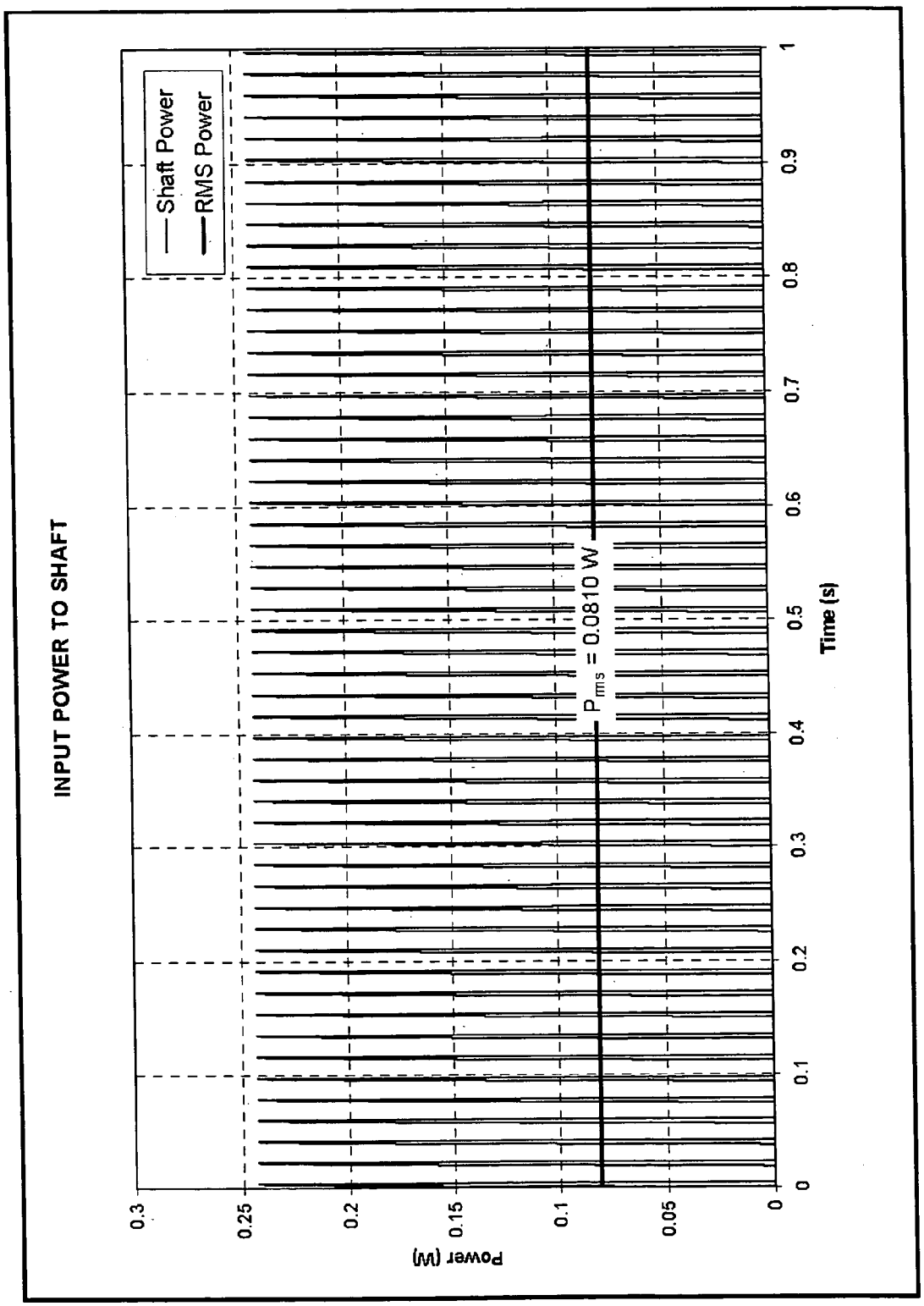
FIG. 6 is a graph showing input power to an example piezoelectric power generator as a function of time in the example scenario of operation.

Since the majority of the time the cam lobe 24 is not engaged with one of the piezoelectric devices 22, the input power to the generator 20 varies depending on the angular position of the shaft (i.e., actuator 24) as is shown in FIG. 6. FIG. 6 shows input power (watts) to the piezoelectric power generator 20 as a function of time (seconds) for the example embodiment discussed above.

Figure 5:
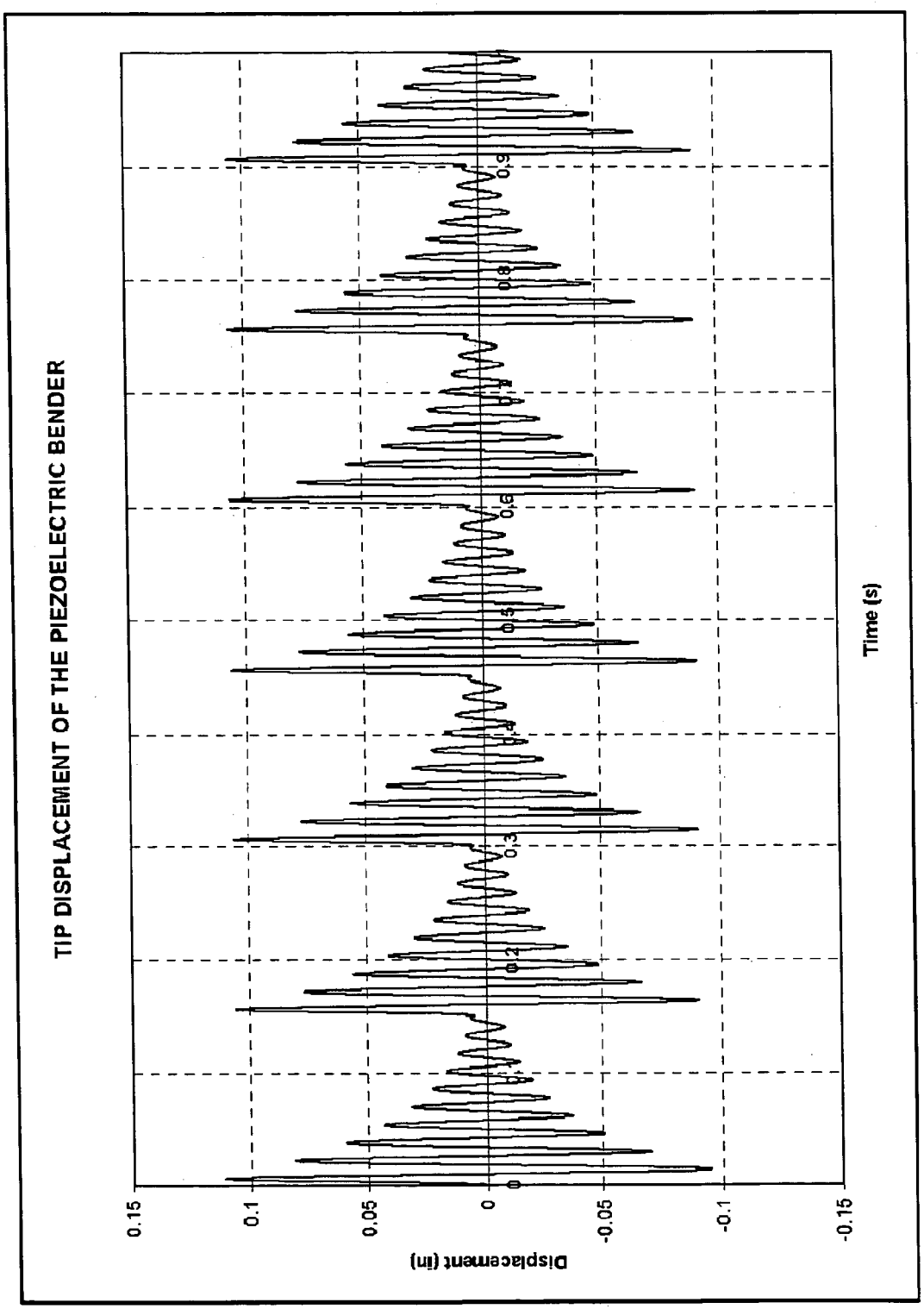
FIG. 5 is a graph showing displacement of a single piezoelectric device over a selected time period comprising plural excitations of the piezoelectric device in an example scenario of operation.

Since the input power is not constant it seems logical to consider the RMS value of the input power as a reasonable measure of the actual input power to the generator. This seems appropriate since the cam lobe is not constantly engaged with a fully deflected cantilever throughout the entire rotation. From FIG. 5 the input power to the generator is $P_{in}=0.0810$ W.

Figure 7:
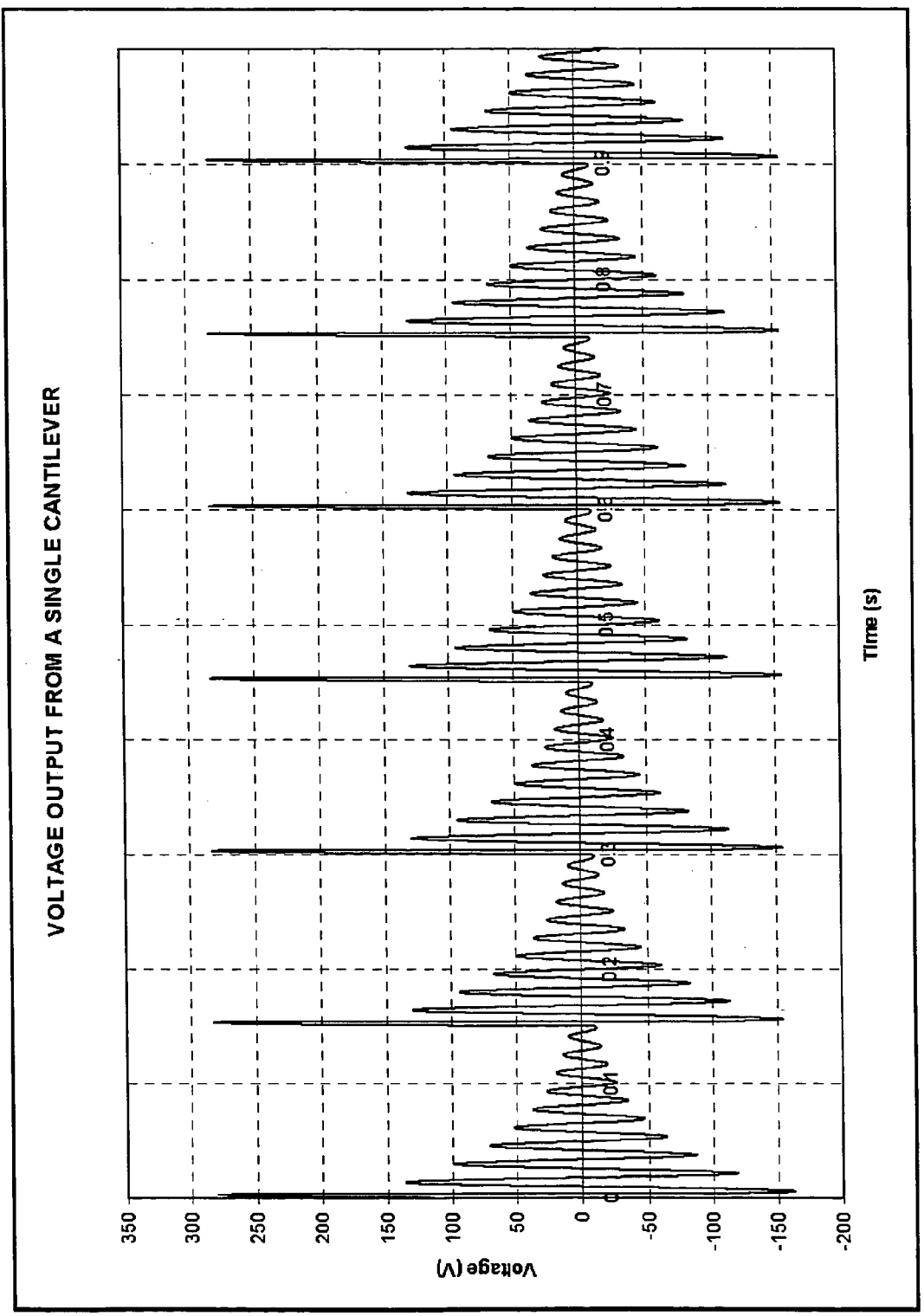
FIG. 7 is a graph showing voltage output from a single piezoelectric device in the example scenario of operation.
Figure 8:
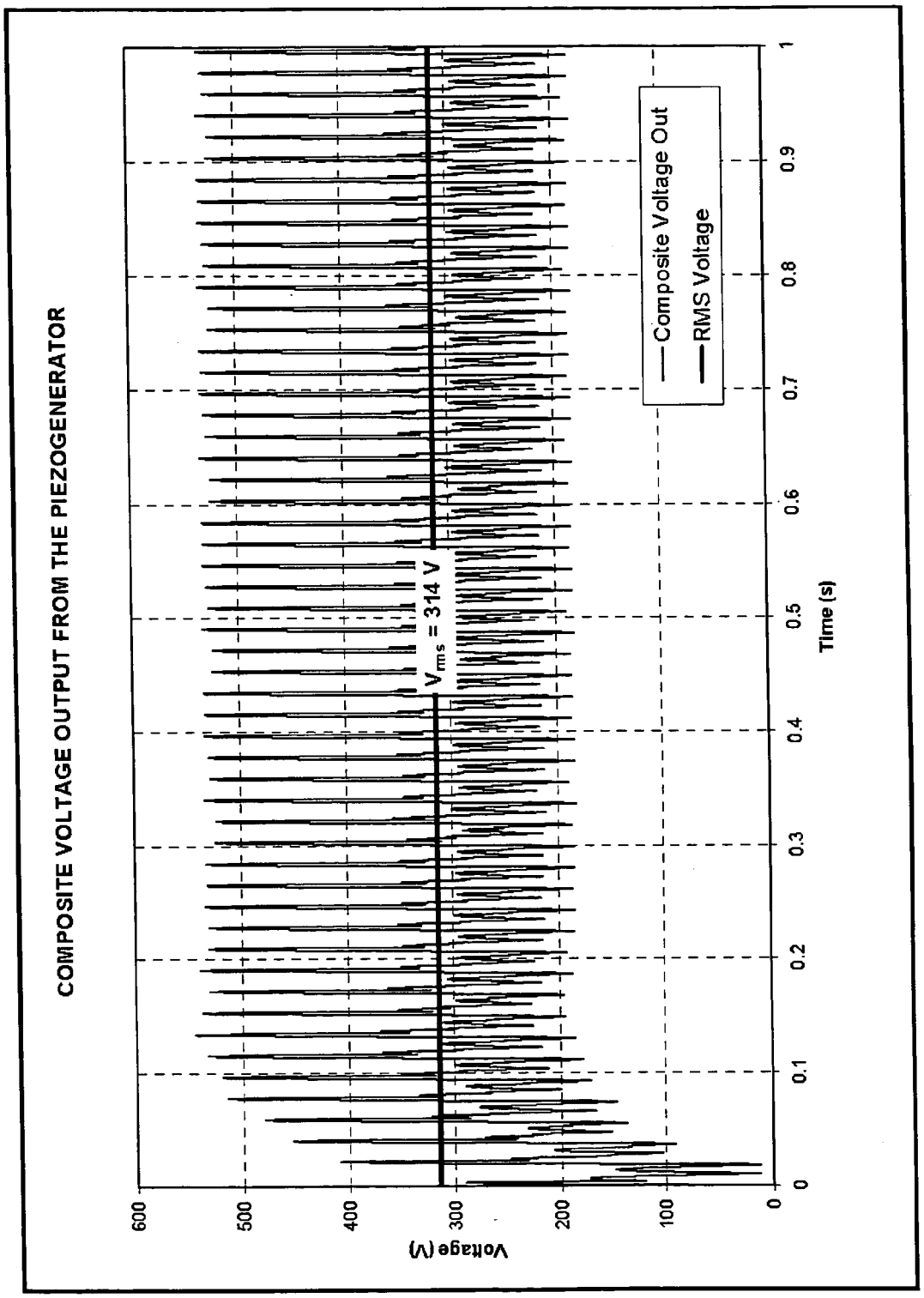
FIG. 8 is a graph showing the composite voltage output from a plurality of piezoelectric devices, and the RMS voltage output from the plurality of piezoelectric devices in the example scenario of operation.
Figure 9:
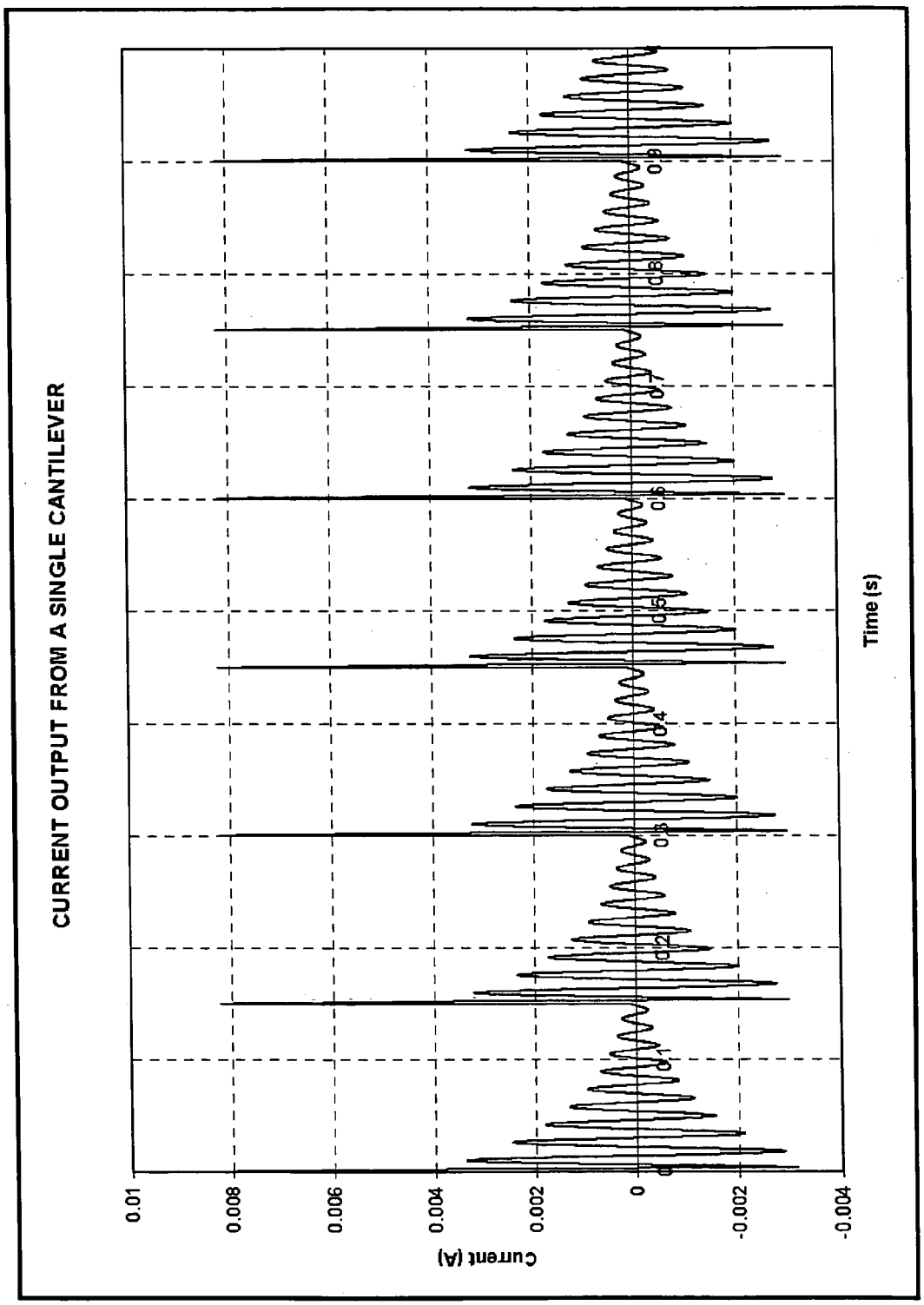
FIG. 9 is a graph showing current output from a single piezoelectric device in the example scenario of operation.
Figure 10:
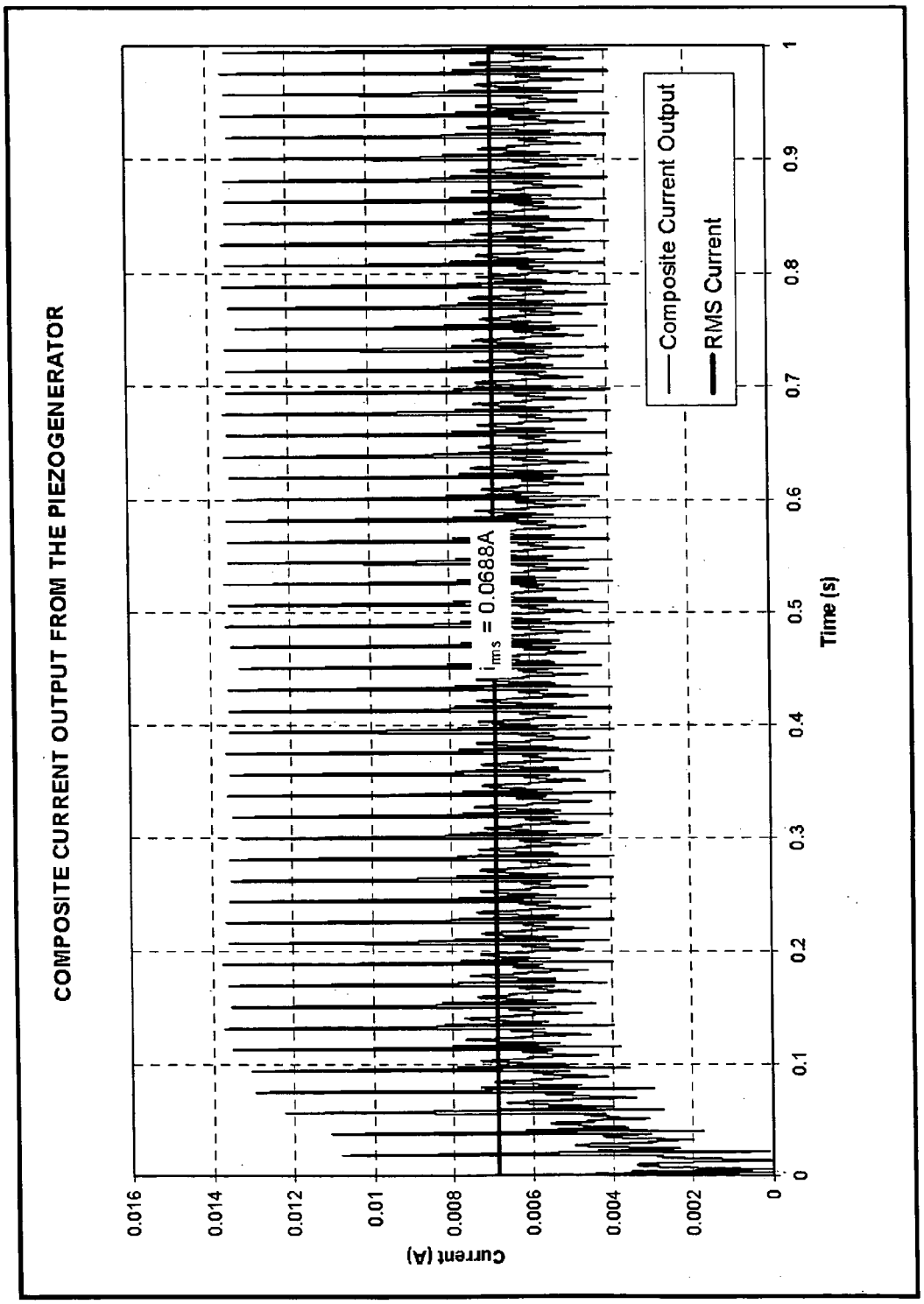
FIG. 10 is a graph showing the composite current output from a plurality of piezoelectric devices, and the RMS current output from the plurality of piezoelectric device in the example scenario of operation.

To determine the average output power of the piezogenerator, the RMS voltage and current from the device need to be determined. The voltage output from a single cantilever (e.g., piezoelectric device 22) is shown in FIG. 7 and the composite voltage output from all eight cantilevers (e.g., piezoelectric devices 22) and the RMS voltage is shown in FIG. 7. Similarly, the current output from a single cantilever is shown in FIG. 9 and the composite current output from all eight cantilevers (e.g., piezoelectric devices 22) and the RMS current is shown in FIG. 10.

Figure 11:
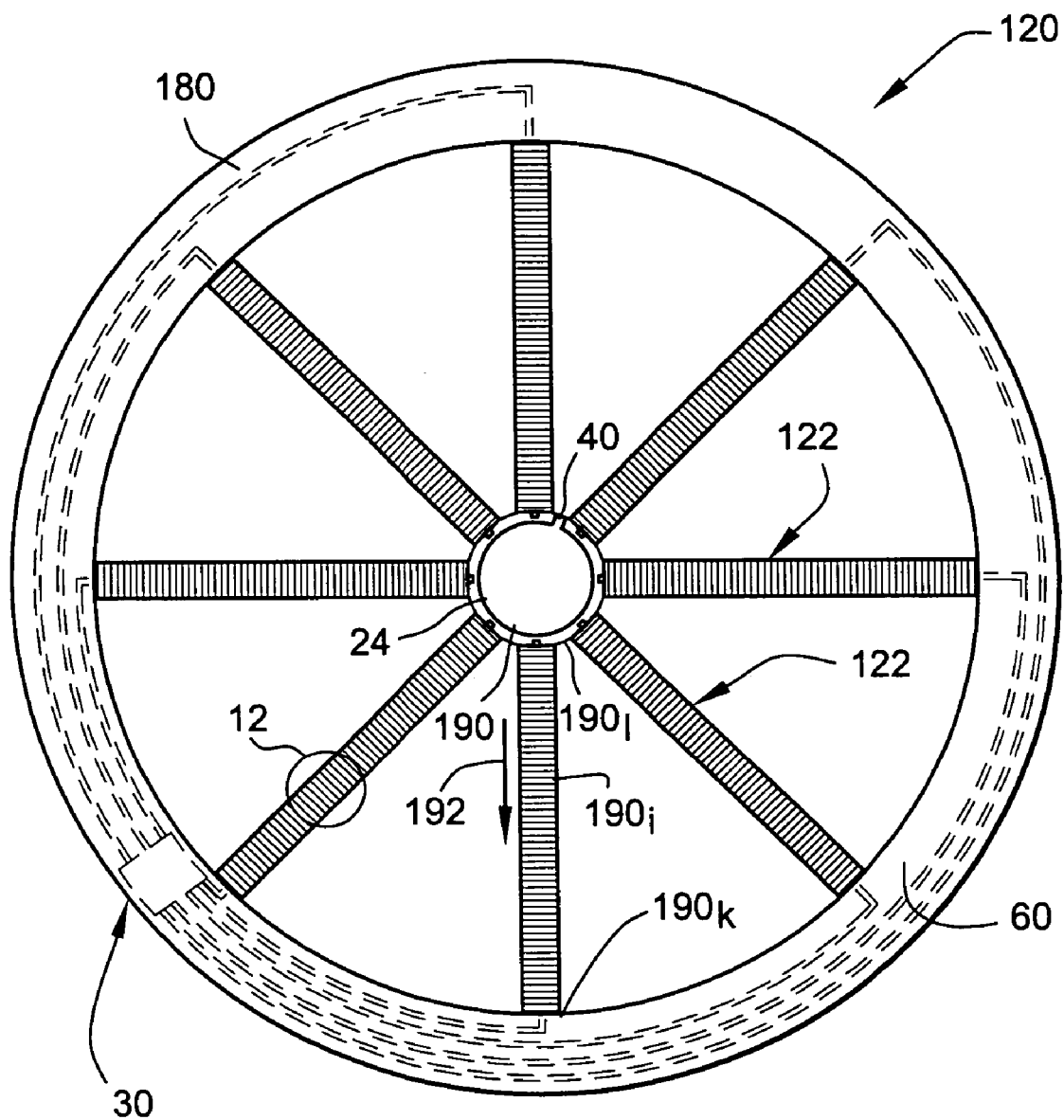
FIG. 11 is a plan view of a second example embodiment of a piezoelectric generator.

FIG. 11 shows a non-limiting second example embodiment of a piezoelectric power generator. In the example embodiment illustrated in FIG. 11, the cantilever piezoelectric device has a vertically layered structure, e.g., a layered structure which capitalizes upon compression of the piezoelectric elements. Unless otherwise noted, the piezoelectric power generator 120 of FIG. 11 comprises elements which are similar to the piezoelectric power generator 20 of FIG. 1 and FIG. 2, for which reason similar reference numerals are used for similar elements. In particular, the piezoelectric power generator 120 of the FIG. 11 embodiment comprises plural piezoelectric devices 122; an actuator 24 positioned to impart an excitation to the plural piezoelectric devices 122 in a predefined sequence; and, an electrical conduction system 30 connected to the plural piezoelectric devices 122 for conducting an electrical charge created by the excitation.

In the example embodiment of FIG. 11, at least one of the plural cantilever piezoelectric devices 122 comprises a stack of piezoceramic layers 190$_i$ which are stacked in a radial direction relative to the circular pattern. For one of the piezoelectric devices 122 of FIG. 11, the piezoceramic layer closest to the actuator 24 is labeled as piezoceramic layer 190$_j$, while the farthest piezoceramic layer from the actuator 24 is labeled as piezoceramic layer 190$_k$. In the example implementation of FIG. 11, the fixed end of the piezoelectric devices 122 do not necessarily protrude into the rim 60. Rather, the fixed end of the piezoelectric devices 122, e.g., piezoceramic layer 190$_k$, abuts a vertical peripheral wall of rim 60. The actuator 24 is a rotary cam having a lobe 40 which excites each of the plural piezoelectric devices 122, preferably once during a revolution of the cam by compressing the stack of piezoceramic layers 190 of a stack in the radial direction as depicted by arrow 192. In other words, arrow 192 shows a direction of the compressive force applied by actuator 24.

Figure 12A:
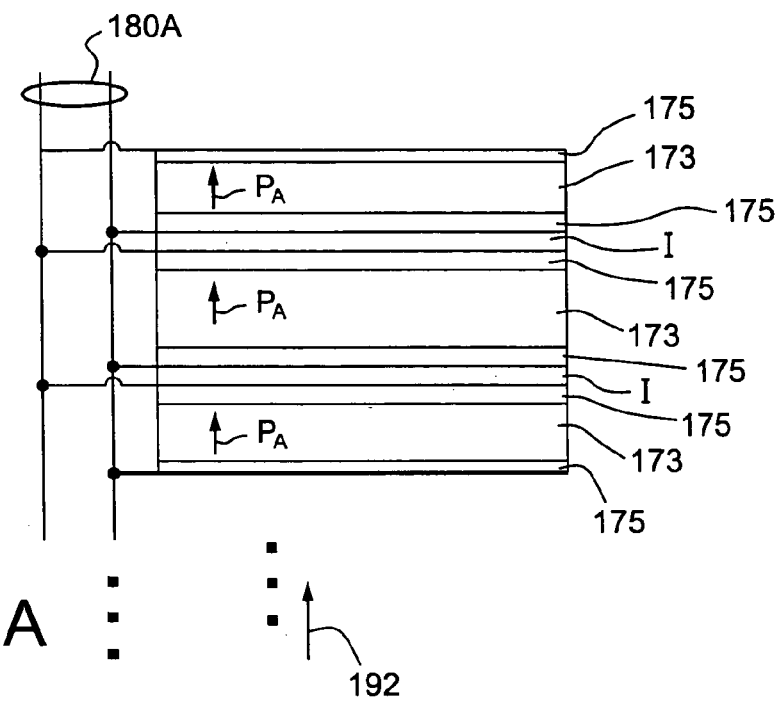
FIG. 12A is a top view of a portion of a piezoelectric device of the embodiment of FIG. 11 wherein the piezoceramic elements have a unidirectional poling.

Specific details of the structure of the piezoelectric devices 122 for the FIG. 11 embodiment depend on the poling direction of the piezoceramic elements included in the stack for each piezoelectric device 122. For example, FIG. 12A shows an enlargement of a portion of a piezoelectric device 122 wherein the piezoceramic elements 173 have unidirectional poling (in the direction of arrows $P_A$). Each piezoceramic element 173 has a sputtered electrode 175 on its opposite major surfaces, as understood from the discussion of the earlier embodiment. In addition, for the unidirectional poling implementation of FIG. 12A, an insulating layer I (e.g., polyimide insulating layer) is provided between sputtered electrodes 175 of adjacent piezoelectric devices 122. Electrical leads are connected to the sputtered electrodes 175, e.g., between each sputtered electrode 175 and an adjacent insulation layer I.

Figure 12B:
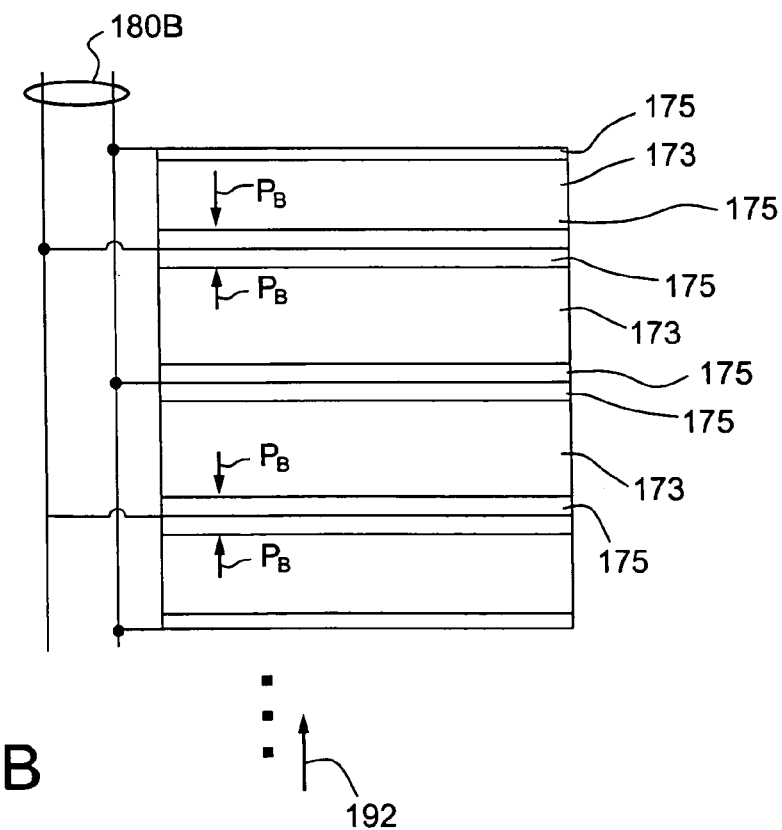
FIG. 12B is a top view of a portion of a piezoelectric device of the embodiment of FIG. 12 wherein the piezoceramic elements have an opposite directional poling.

As another example of how poling affects the structure, FIG. 12B shows an enlargement of a portion of a piezoelectric device 122 wherein the piezoceramic elements 173 have opposite directional poling (in the direction of arrows $P_B$). As previously described, each piezoceramic element 173 has a sputtered electrode 175 on its opposite major surfaces. But in the implementation of FIG. 12B with its opposite direction poling, no insulating layer is provided or required between sputtered electrodes 175 of adjacent piezoelectric devices 122.

Figure 13:
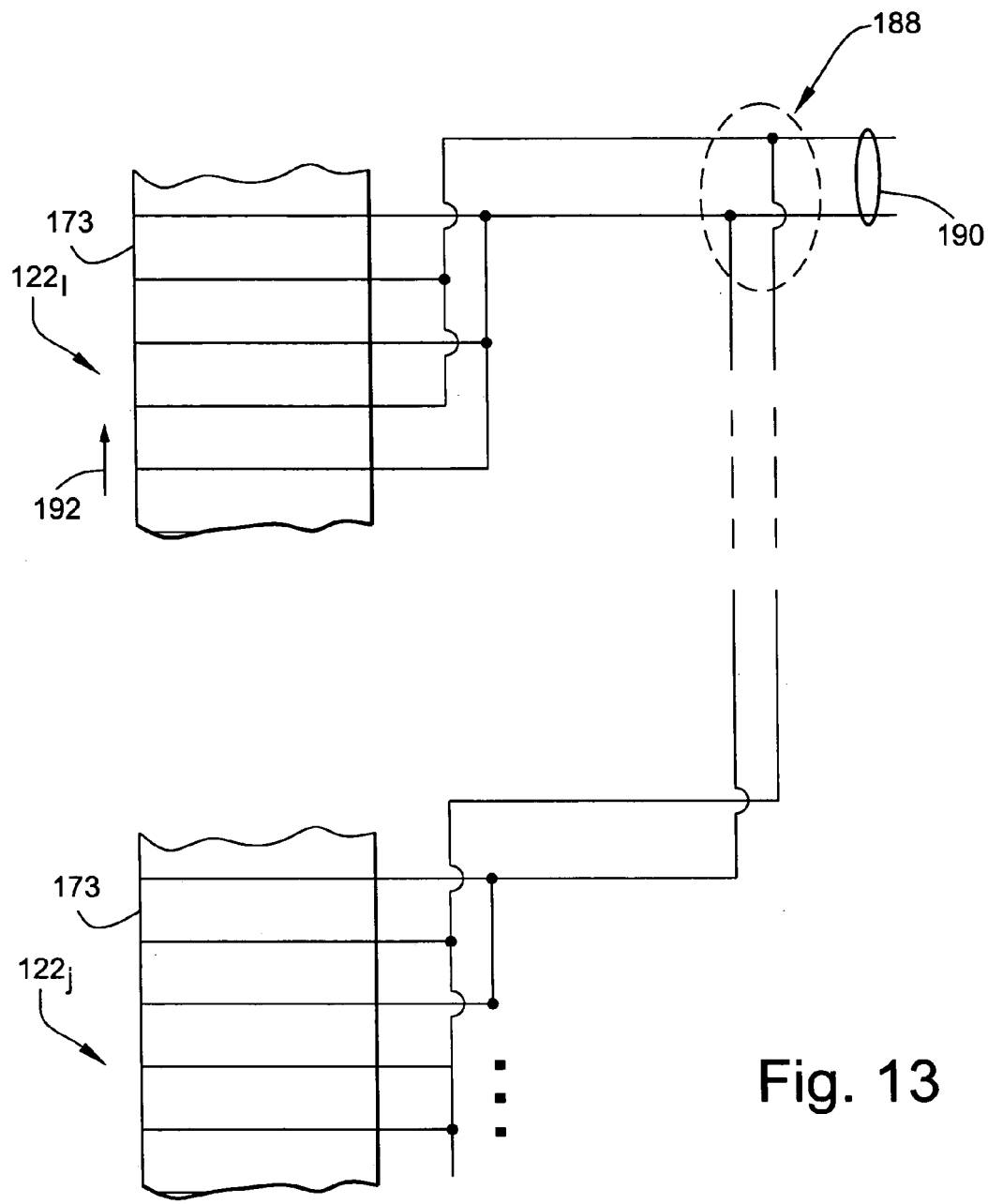
FIG. 13 is a schematic view of an example electrical circuit utilized in an electrical conduction system of the piezoelectric power generator of FIG. 11.

FIG. 13 generically depicts an example electrical circuit 84 suitable for use with either the implementation of FIG. 12A or the implementation of FIG. 12B, the piezoelectric device 122 of FIG. 13 shown as comprising piezoceramic elements 173 without regard to poling direction. FIG. 13 primarily shows that the currents generated by the various piezoelectric devices 122$_1$–122$_J$ need not be rectified, but are summed at adder 188. Since the compressive force (in direction 192) on the stack of piezoceramic elements 173 only results in a positive voltage output from each stack, it is unnecessary to rectify the signal. The voltage outputs from each piezoelectric device 122 can simply be summed at adder 188 to result in the output signal. As mentioned previously, the output signal on line 190 can be appropriately connected to, e.g., a load, a battery, a capacitance, or other charge storage device.

The electrical leads 80, 180 can be formed in various ways. For example, the electrical leads can be screened onto the edges of the stacks forming the piezoelectric device 122.

As understood from the discussion of the motive device for the embodiment of FIG. 1, different types of motive devices can also be utilized for the embodiment of FIG. 11, including but not limited to those depicted in FIG. 2A–FIG. 2F.

Figure 14A:
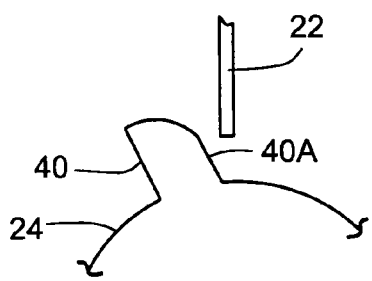
FIG. 14A and FIG. 14B are top views of portions of actuators, showing useful example cam lobe profiles.
Figure 14B:
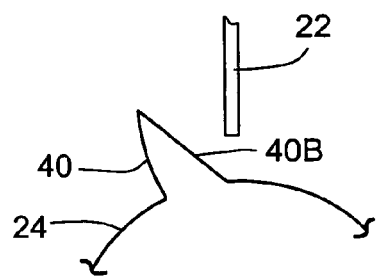

As one separate aspect, the lobe 40 actuator 24 is preferably configured to have a smooth leading edge 40A as shown in FIG. 14A, or a sloped leading edge 40B as shown in FIG. 14B. The leading edge of the lobe 40 is thus preferably configured to release the piezoelectric devices 22 or 122 at a maximum dynamic stress value. As appreciated by those skilled in the art, the maximum dynamic stress value is less than the ultimate tensile stress value at which the piezoelectric begins to depole.

A method of operating a piezoelectric power generator comprises the steps of using an actuator 24 to impart an excitation to plural piezoelectric devices arranged in a predefined sequence, and (when necessary) rectifying and conducting an electrical current created by the excitation. Preferably, the actuator 24 excites a given plural piezoelectric device after a previous excitation response for the given plural piezoelectric devices has essentially fully decayed. Preferably, the actuator applies a force to each plural piezoelectric device which proximates a maximum allowable stress for the plural piezoelectric device.

Two basic plural piezoelectric device configurations have been described. A first configuration of piezoelectric devices illustrated in FIG. 1–FIG. 3 employs many cantilevered "bender" piezogenerators 22 to produce a larger power output. Since the charge produced by a bender piezogenerator 22 is a function of the square of the length of the device considerable amounts of energy can be produced in relatively small packages.

The second plural piezoelectric device configuration described with reference to FIG. 11 comprises piezoelectric devices 122 formed from piezoelectric stacks. A piezoelectric stack is produced by stacking up many thin layers 190 of piezoceramics which include electrodes 175. When the entire stack is strained, the charge produced by each layer can be summed to produce a fairly sizable current. Using multiple stacks can produce considerable power.

Both the shear stacked and compressive stacked types of plural piezoelectric device configurations, and other types as well, can be utilized in a rotary piezogenerator. In a rotary piezogenerator, several piezoelectric benders (e.g., cantilevers), or several stacks, are situated around a rotating cam shaft or actuator 24. The lobe(s) 40 on the rotating camshaft or actuator 24 provide the excitation to the piezoelectric benders 22, or compress the stacks comprising each piezoelectric device 122, on each rotation.

Figure 15:
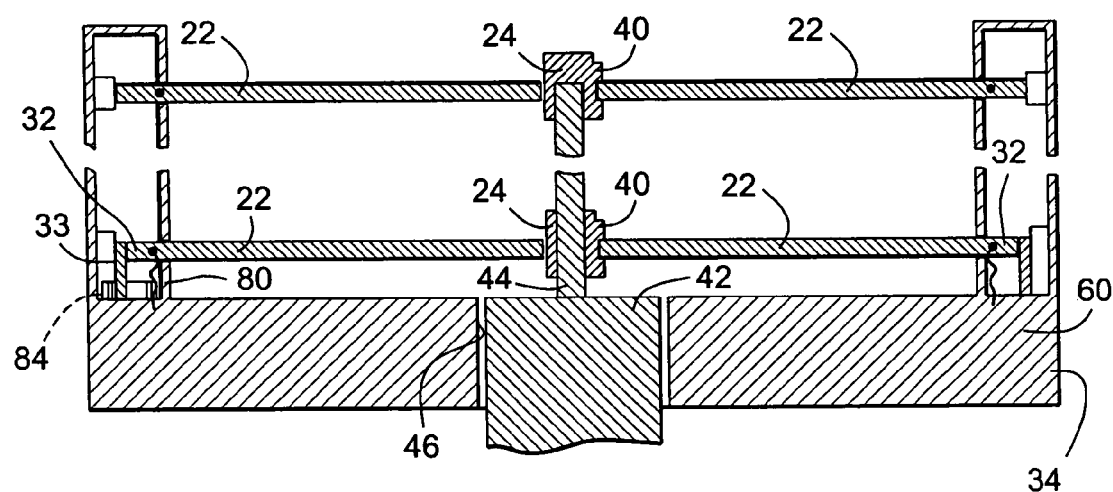
FIG. 15 is a side sectional view of an assembly having stacked piezoelectric generators.

Further, a plurality of rotary piezoelectric generators can be operated in parallel. In this regard, FIG. 15 shows a generator assembly comprising tiers of rotary piezoelectric generators stacked in parallel planes. In the example of FIG. 15, a common drive shaft 44 is shared by two or more tiers of piezoelectric power generators. Each tier has its own actuator 24 (mounted on the common drive shaft 44), as well as its own set of piezoelectric devices 22 (or piezoelectric device 122) which are stressed by the respective actuator 24. The number of tiers or parallel piezoelectric power generators serves as a multiplier of the amount of the energy output. For example, an assembly with eight tiers or eight parallel systems would provide eight times as much output, but would not necessarily operate with eight times greater efficiency in view of the fact that greater input energy would also be required.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A piezoelectric power generator comprising:
    plural cantilever piezoelectric devices arranged in a predefined pattern, at least one of the plural piezoelectric devices comprising a stack of plural piezoceramic layers which are stacked in a compression direction;
    an actuator positioned for imparting a compression force in the compression direction to the plural piezoelectric devices and thereby straining the plural piezoelectric layers of the stack;
    an electrical conduction system connected to sum a charge produced by the plural piezoelectric layers of each stack and for conducting an electrical current created by straining of the plural piezoelectric layers of the stack.

2. The apparatus of claim 1, wherein the actuator comprises a rotary member positioned proximate a center of the circular pattern, and wherein the piezoceramic layers are stacked in a radial direction relative to the circular pattern.

3. The apparatus of claim 2, wherein the actuator comprises a rotary cam having one lobe which excites each of the plural piezoelectric devices by compressing the stack of piezoceramic layers of a stack.

4. The apparatus of claim 1, wherein a rotational speed of the actuator permits an excitation response for a given plural piezoelectric device to essentially fully decay before the given plural piezoelectric device is again excited.

5. The apparatus of claim 1, wherein the predefined pattern is configured so that a sum of current output of the plural piezoelectric devices overlaps in such a way that a greatest average output power is obtained.

6. The apparatus of claim 1, further comprising
    a motive device for moving the actuator, the motive device comprising a turbine.

7. The apparatus of claim 6, wherein the motive device comprises a windmill type turbine having wind vanes.

8. The apparatus of claim 6, wherein the motive device comprises a paddlewheel type turbine.

9. The apparatus of claim 6, wherein the actuator comprises a cam having at least one cam lobe which contacts the plural piezoelectric devices.

10. The apparatus of claim 1, wherein the actuator comprises a rotary cam having one lobe which excites each of the plural piezoelectric devices by compressing the stack of piezoceramic layers of a stack.

11. The apparatus of claim 1, wherein an insulation layer is positioned between an adjacent pair of piezoceramic layers of the stack.

12. A method of operating a piezoelectric power generator comprising:
    using an actuator to impart an excitation to plural piezoelectric devices arranged in a predefined pattern, each piezoelectric device comprising a cantilever device having a deflectable cantilever tip, the plural piezoelectric devices being arranged in a predetermined relationship relative to the actuator;
    conducting an electrical current created by the excitation;
    wherein a ratio of the magnitude of defection to a bending length of the piezoelectric device is 0.125:2.0.

13. A piezoelectric power generator comprising:
    plural piezoelectric devices arranged in a predefined pattern, each piezoelectric device comprising a cantilever device having a deflectable cantilever tip;
    an actuator positioned to impart an excitation to the plural piezoelectric devices;
    an electrical conduction system connected to the plural piezoelectric devices for conducting an electrical current created by the excitation,
    wherein the plural piezoelectric devices are arranged in a circular pattern relative to the actuator;
    wherein the actuator comprises a rotary member positioned proximate a center of the circular pattern;
    wherein at least one of the plural piezoelectric devices comprises a cantilever device having a fixed end proximate a perimeter of the circular pattern and the cantilever tip proximate the center of the circular pattern; and
    wherein the actuator comprises a rotary cam having one lobe which excites the at least one cantilever device.

14. A piezoelectric power generator comprising:
    plural piezoelectric devices arranged in a predefined pattern, each piezoelectric device comprising a cantilever device having a deflectable cantilever tip;
    an actuator configured to impart an excitation to the plural piezoelectric devices;
    an electrical conduction system connected to the plural piezoelectric devices for conducting an electrical current created by the excitation,
    wherein the plural piezoelectric devices are arranged in a predetermined relationship relative to the actuator;
    a driver for the actuator configured to cause the actuator to excite a given plural piezoelectric device after a previous excitation response for the given plural piezoelectric devices has essentially fully decayed;
    wherein the actuator comprises a cam having one cam lobe which contacts the plural piezoelectric devices.

15. A method of operating a piezoelectric power generator comprising:
    using an actuator to impart an excitation to plural piezoelectric devices arranged in a predefined pattern, each piezoelectric device comprising a cantilever device having a deflectable cantilever tip, the plural piezoelectric being arranged in a predetermined relationship relative to the actuator;
    conducting an electrical current created by the excitation;
    causing the actuator to excite a given plural piezoelectric device after a previous excitation response for the given plural piezoelectric devices has essentially fully decayed; and
    wherein the actuator comprises a cam having one cam lobe, and further comprising
    using the one cam lobe to contact the plural piezoelectric devices.

16. A piezoelectric power generator comprising:
    plural piezoelectric devices arranged in a predefined pattern, each piezoelectric device comprising a cantilever device having a deflectable cantilever tip;
    an actuator configured to impart an excitation to the plural piezoelectric devices;
    an electrical conduction system connected to the plural piezoelectric devices for conducting an electrical current created by the excitation,
    wherein the plural piezoelectric devices are arranged in a predetermined relationship relative to the actuator;

wherein the plural piezoelectric devices are arranged in the predetermined relationship relative to the actuator whereby only one of the plural piezoelectric devices is actuated at a time.

17. The apparatus of claim 16, wherein the predefined pattern is configured so that a sum of current output of the plural piezoelectric devices overlaps in such a way that a greatest average output power is obtained.

18. The apparatus of claim 17, wherein each the cantilever piezoelectric devices comprises:
   an elongated core;
   a first piezoceramic element bonded to a first side of the core;
   a second piezoceramic element bonded to a second side of the core.

19. The apparatus of claim 18, further comprising:
   a first covering bonded to the first piezoceramic element;
   a second covering bonded to the second piezoceramic element.

20. The apparatus of claim 16, wherein the electrical conduction system comprises plural electrical leads connected to respective ones of the plural piezoelectric devices.

21. The apparatus of claim 16, further comprising a motive device for moving the actuator, and wherein the motive device comprises a turbine.

22. The apparatus of claim 21, wherein the motive device comprises a windmill type turbine having wind vanes.

23. The apparatus of claim 21, wherein the motive device comprises a paddlewheel type turbine.

24. A piezoelectric power generator comprising:
   plural piezoelectric devices arranged in a predefined pattern, each piezoelectric device comprising a cantilever device having a deflectable cantilever tip;
   an actuator configured to impart an excitation to the plural piezoelectric devices;
   an electrical conduction system connected to the plural piezoelectric devices for conducting an electrical current created by the excitation,
   wherein the plural piezoelectric devices are arranged in a predetermined relationship relative to the actuator;
   wherein a ratio of the magnitude of defection to a bending length of the piezoelectric device is 0.125:2.0.

25. A method of operating a piezoelectric power generator comprising:
   using an actuator to impart an excitation to plural piezoelectric devices arranged in a predefined pattern, each piezoelectric device comprising a cantilever device having a deflectable cantilever tip, the plural piezoelectric devices being arranged in a predetermined relationship relative to the actuator;
   conducting an electrical current created by the excitation;
   wherein the plural piezoelectric devices are arranged in the predetermined relationship relative to the actuator whereby only one of the plural piezoelectric devices is actuated at a time.

26. The method of claim 25, comprising arranging the plural piezoelectric devices in an angular pattern relative to the actuator.

27. The method of claim 26, comprising arranging the plural piezoelectric devices in a circular pattern relative to the actuator.

28. The method of claim 27, wherein the actuator comprises a rotary member, and comprising positioning the actuator proximate a center of the circular pattern.

* * * * *